United States Patent
Shikauchi et al.

(10) Patent No.: US 9,520,286 B2
(45) Date of Patent: Dec. 13, 2016

(54) SEMICONDUCTOR SUBSTRATE, SEMICONDUCTOR DEVICE AND METHOD OF MANUFACTURING THE SEMICONDUCTOR DEVICE

(71) Applicants: SANKEN ELECTRIC CO., LTD., Niiza-shi, Saitama (JP); SHIN-ETSU HANDOTAI CO., LTD., Tokyo (JP)

(72) Inventors: Hiroshi Shikauchi, Niiza (JP); Ken Sato, Miyoshi (JP); Hirokazu Goto, Minato (JP); Masaru Shinomiya, Annaka (JP); Keitaro Tsuchiya, Takasaki (JP); Kazunori Hagimoto, Takasaki (JP)

(73) Assignees: SHANKEN ELECTRIC CO., LTD., Niiza-shi (JP); SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/892,034

(22) PCT Filed: May 2, 2014

(86) PCT No.: PCT/JP2014/002403
§ 371 (c)(1),
(2) Date: Nov. 18, 2015

(87) PCT Pub. No.: WO2014/192227
PCT Pub. Date: Apr. 12, 2014

(65) Prior Publication Data
US 2016/0111273 A1 Apr. 21, 2016

(30) Foreign Application Priority Data
May 31, 2013 (JP) .................................. 2013-115449

(51) Int. Cl.
*H01L 29/36* (2006.01)
*H01L 21/02* (2006.01)
(Continued)

(52) U.S. Cl.
CPC ....... *H01L 21/0254* (2013.01); *H01L 21/0251* (2013.01); *H01L 21/02378* (2013.01);
(Continued)

(58) Field of Classification Search
CPC .................. H01L 21/02378; H01L 21/02381; H01L 21/02458; H01L 21/02507; H01L 21/0251; H01L 21/0254; H01L 29/157; H01L 29/2003; H01L 29/205; H01L 29/66462; H01L 29/7786; H01L 29/7787
See application file for complete search history.

(56) References Cited

U.S. PATENT DOCUMENTS

| 5,766,783 A | 6/1998 | Utsumi et al. |
| 6,521,041 B2 * | 2/2003 | Wu ..................... H01L 21/2007 117/915 |

(Continued)

FOREIGN PATENT DOCUMENTS

| JP | H08-239752 A | 9/1996 |
| JP | 2005-129856 A | 5/2005 |

(Continued)

OTHER PUBLICATIONS

Dec. 1, 2015 International Preliminary Report on Patentability issued in International Patent Application No. PCT/JP2014/002403.
(Continued)

*Primary Examiner* — Allan R Wilson
(74) *Attorney, Agent, or Firm* — Oliff PLC (57) ABSTRACT

A semiconductor substrate having a silicon-based substrate, a buffer layer provided on the silicon-based substrate and made of a nitride semiconductor containing boron, and an
(Continued)

operation layer formed on the buffer layer, wherein a concentration of boron in the buffer layer gradually decreasing toward a side of the operation layer from a side of the silicon-based substrate. Thereby, the semiconductor substrate in which the buffer layer contains boron sufficient to obtain a dislocation suppression effect and boron is not diffused to the operation layer is provided.

20 Claims, 5 Drawing Sheets (51) Int. Cl.
    *H01L 29/66*     (2006.01)
    *H01L 29/20*     (2006.01)
    *H01L 29/15*     (2006.01)
    *H01L 29/205*     (2006.01)
    *H01L 29/778*     (2006.01)
    *H01L 29/10*     (2006.01)

(52) U.S. Cl.
    CPC .. *H01L 21/02381* (2013.01); *H01L 21/02458* (2013.01); *H01L 21/02507* (2013.01); *H01L 29/157* (2013.01); *H01L 29/2003* (2013.01); *H01L 29/205* (2013.01); *H01L 29/36* (2013.01); *H01L 29/66462* (2013.01); *H01L 29/7786* (2013.01); *H01L 29/7787* (2013.01); *H01L 29/1075* (2013.01)

(56) References Cited

U.S. PATENT DOCUMENTS

| | | | |
|---|---|---|---|
| 6,750,119 B2 * | 6/2004 | Chu | C23C 16/32 427/249.1 |
| 2006/0118824 A1 * | 6/2006 | Otsuka | H01L 29/7787 257/194 |
| 2007/0210329 A1 | 9/2007 | Goto | |
| 2009/0090916 A1 * | 4/2009 | Yamazaki | H01L 29/04 257/66 |
| 2011/0298009 A1 * | 12/2011 | Ikuta | H01L 21/02381 257/190 |
| 2012/0217543 A1 | 8/2012 | Minoura et al. | |
| 2013/0075786 A1 | 3/2013 | Ishiguro | |
| 2015/0082918 A1 * | 3/2015 | Fuji | G01L 1/125 73/862.69 |
| 2015/0177284 A1 * | 6/2015 | Fukuzawa | G01R 19/0092 324/117 R |
| 2016/0126099 A1 * | 5/2016 | Shikauchi | H01L 29/36 257/655 |

FOREIGN PATENT DOCUMENTS

| | | |
|---|---|---|
| JP | 2007-242853 A | 9/2007 |
| JP | 2008-277590 A | 11/2008 |
| JP | 2012-178467 A | 9/2012 |
| JP | 2013-074211 A | 4/2013 |
| TW | 201236082 A | 9/2012 |
| TW | 201314889 A | 4/2013 |

OTHER PUBLICATIONS

Jan. 27, 2014 Office Action issued in Japanese Patent Application No. 2013-115449.
Aug. 12, 2014 International Search Report issued in International Patent Application No. PCT/JP2014/002403.
Jul. 19, 2016 Search Report issued in Taiwanese Application No. 103116419.

* cited by examiner

SEMICONDUCTOR SUBSTRATE, SEMICONDUCTOR DEVICE AND METHOD OF MANUFACTURING THE SEMICONDUCTOR DEVICE

BACKGROUND OF THE INVENTION

1. Field of the Invention

The present invention relates to a semiconductor substrate, a semiconductor device and a method of manufacturing the semiconductor device, and, more particularly, to a semiconductor substrate having a nitride semiconductor layer, a semiconductor device using the semiconductor substrate and a method of manufacturing the semiconductor device.

2. Description of the Related Art

The nitride semiconductor layer is typically formed on an inexpensive silicon substrate or a sapphire substrate. However, these substrates have lattice constants largely different from a lattice constant of the nitride semiconductor layer, and have coefficients of thermal expansion different from a coefficient of thermal expansion of the nitride semiconductor layer. Therefore, large distortion energy is generated in the nitride semiconductor layer formed on the substrate by epitaxial growth. As a result, a crack is likely to occur on the nitride semiconductor layer or crystal quality is likely to degrade.

To solve the above-described problem, conventionally, a buffer layer in which nitride semiconductor layers having different composition are stacked has been disposed between the substrate and a functional layer comprised of a nitride semiconductor.

Further, to improve characteristics of the nitride semiconductor layer, various proposals have been made as to the buffer layer.

For example, Patent Literature 1 discloses that the buffer layer contains boron to suppress dislocation.

Further, Patent Literature 2 discloses using a nitride aluminum layer which contains boron whose concentration increases toward the functional layer as the buffer layer to obtain a boron containing nitride aluminum thin film (functional layer) having an excellent crystallinity.

Still further, Patent Literature 3 discloses suppressing a leak current due to two dimensional electron gas in the buffer layer by using the buffer layer including a first layer comprised of a GaN layer containing boron and phosphorus and a second layer comprised of an AlInGaAsN layer containing phosphorus.

CITATION LIST

Patent Literatures

[Patent Literature 1]
Japanese Patent Laid-Open No. 2008-277590
[Patent Literature 2]
Japanese Patent Laid-Open No. 8-239752
[Patent Literature 3]
Japanese Patent Laid-Open No. 2005-129856

SUMMARY OF THE INVENTION

As described above, to improve characteristics of the nitride semiconductor layer formed on a silicon substrate or on a sapphire substrate, measures such as providing a buffer layer and optimizing a constitution of the buffer layer have been taken.

However, the present inventors found the following problem.

That is, when boron is doped to a region close to a device operation layer (functional layer) in the buffer layer to suppress dislocation, impurities are diffused in the operation layer, which degrades characteristics of the device.

The present invention has been made in view of the above-described problem, and an object of the present invention is to provide a semiconductor substrate in which a buffer layer contains boron sufficient to obtain a dislocation suppression effect while boron is not diffused to the operation layer, a semiconductor device using the semiconductor substrate and a method of manufacturing the semiconductor device.

To achieve the above-described object, the present invention provides a semiconductor substrate having a silicon-based substrate, a buffer layer formed on the silicon-based substrate and comprised of a nitride semiconductor containing boron, and an operation layer formed on the buffer layer, wherein a concentration of boron in the buffer layer gradually decreasing toward a side of the operation layer from a side of the silicon-based substrate.

In this manner, because the concentration of boron in the buffer layer gradually decreases toward the side of the operation layer from the side of the silicon-based substrate, the concentration of boron is high in a lower layer of the buffer layer so that it is possible to obtain a dislocation suppression effect and suppress pit generation in the operation layer formed on the buffer layer, while the concentration of boron is low in an upper layer of the buffer layer so that it is possible to suppress influence of impurities (degradation of characteristics of the device and degradation of crystallinity due to impurities) on the operation layer.

Here, it is preferable that the buffer layer is a stacked body in which a first layer comprised of $Al_yGa_{1-y}N$ and a second layer comprised of $Al_xGa_{1-x}N (0 \leq x < y \leq 1)$ are repeatedly stacked, and both of the first layer and the second layer contain the boron.

In this manner, when both of the first layer comprised of $Al_yGa_{1-y}N$ and the second layer comprised of $Al_xGa_{1-x}N$ $(0 \leq x < y \leq 1)$ of the buffer layer contain boron, it is possible to more effectively suppress dislocation.

Further, it is preferable that a concentration of boron of the silicon-based substrate is higher than a concentration of boron in a region at a side of the silicon-based substrate in the buffer layer.

In this manner, when the concentration of boron of the silicon-based substrate is higher than the concentration of boron in the region at the side of the silicon-based substrate in the buffer layer, it is possible to more effectively suppress dislocation.

Further, to achieve the above-described object, there is provided a semiconductor device having the above-described semiconductor substrate, a first electrode formed on the operation layer, and a second electrode formed on the operation layer, the first electrode and the second electrode being disposed so that a current flows from the first electrode to the second electrode via the operation layer.

In this manner, according to the semiconductor device using the semiconductor substrate in which the concentration of boron in the buffer layer gradually decreases toward the side of the operation layer from the side of the silicon-based substrate, it is possible to obtain excellent device characteristics.

Further, to achieve the above-described object, there is provided a method of manufacturing a semiconductor device including forming a buffer layer comprised of a nitride semiconductor on a silicon-based substrate and forming an operation layer on the buffer layer, wherein the step of forming the buffer layer including a stage in which boron is introduced into the buffer layer such that a concentration of boron in the buffer layer gradually decreases toward a side of the operation layer from a side of the silicon-based substrate.

According to such a method, it is possible to manufacture the semiconductor device of the present invention. Particularly, because the step of forming the buffer layer includes the stage in which boron is introduced into the buffer layer such that the concentration of boron in the buffer layer gradually decreases toward the side of the operation layer from the side of the silicon-based substrate, it is possible to efficiently cause the concentration of boron in the buffer layer to gradually decrease toward the side of the operation layer from the side of the silicon-based substrate.

Here, the stage in which boron is introduced into the buffer layer can include a stage in which boron is diffused in the buffer layer from the silicon-based substrate in which boron is doped by thermal diffusion.

In this manner, by introducing boron into the buffer layer while boron is diffused in the buffer layer from the silicon-based substrate in which boron is doped by thermal diffusion, it is possible to more efficiently cause the concentration of boron in the buffer layer to gradually decrease toward the side of the operation layer from the side of the silicon-based substrate.

Further, the stage in which boron is introduced into the buffer layer can include a stage in which boron is doped from a vapor phase by introducing dopant gas when the buffer layer is formed by vapor phase epitaxial growth.

In this manner, by doping boron from the vapor phase by introducing dopant gas during vapor phase epitaxial growth and introducing boron into the buffer layer, the buffer layer can contain boron sufficient to obtain a dislocation suppression effect.

Further, it is preferable that, as the buffer layer, a stacked body in which a first layer comprised of $Al_yGa_{1-y}N$ and a second layer comprised of $Al_xGa_{1-x}N$ ($0 \leq x < y \leq 1$) are repeatedly stacked is formed, and both of the first layer and the second layer contain the boron.

In this manner, when both of the first layer comprised of $Al_yGa_{1-y}N$ and the second layer comprised of $Al_xGa_{1-x}N$ ($0 \leq x < y \leq 1$) of the buffer layer contain boron, it is more effectively suppress dislocation.

Further, it is preferable that a concentration of boron of the silicon-based substrate is made higher than a concentration of boron in a region at a side of the silicon-based substrate of the buffer layer.

In this manner, by making the concentration of boron of the silicon-based substrate higher than the concentration of boron in the region at the side of the silicon-based substrate of the buffer layer, it is possible to more effectively suppress dislocation.

As described above, according to the present invention, it is possible to provide a semiconductor substrate in which a buffer layer contains boron sufficient to obtain a dislocation suppression effect while the boron is not diffused to an operation layer, a semiconductor device using the semiconductor substrate and a method of manufacturing the semiconductor device.

DETAILED DESCRIPTION OF THE PREFERRED EMBODIMENTS

While the present invention will be described below in detail with reference to the drawings as one example of embodiments, the present invention is not limited to this.

As described above, while it is necessary to dope boron in the buffer layer to suppress dislocation, if boron is doped to a region close to a device operation layer in the buffer layer, there is a problem that impurities are diffused in the operation layer, which causes degradation of characteristics of the device.

Therefore, the present inventors have diligently studied a semiconductor substrate in which impurities are not diffused in an operation layer when boron is doped in a buffer layer.

As a result, the present inventors have found that, by causing a concentration of boron in the buffer layer to gradually decrease toward a side of the operation layer from a side of a silicon-based substrate, a concentration of boron becomes high in a lower layer of the buffer layer and becomes low in an upper layer of the buffer layer, so that it is possible to suppress pit generation in the operation layer and suppress influence of impurities on the operation layer, and have achieved the present invention.

Figure 1:
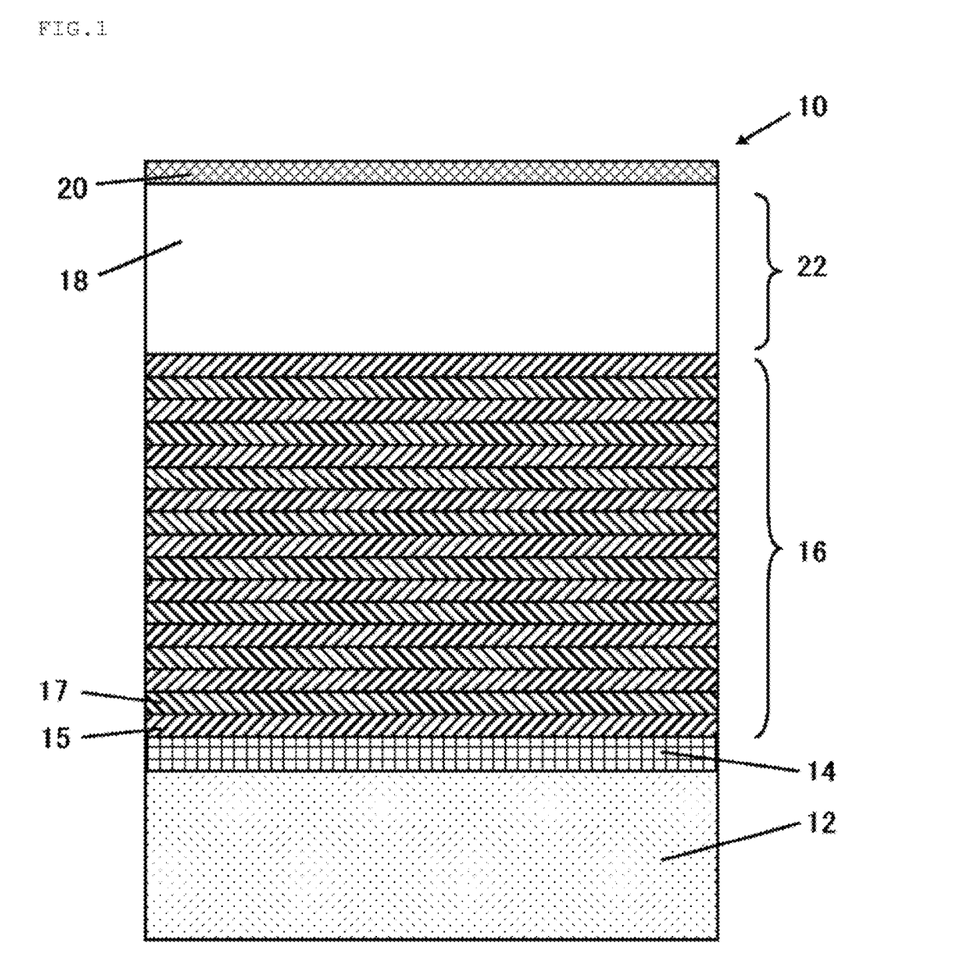
FIG. 1 is a schematic cross-sectional view illustrating an example of a semiconductor substrate according to an embodiment of the present invention.

FIG. 1 is a schematic cross-sectional view illustrating an example of a semiconductor substrate of the present invention.

A semiconductor substrate 10 of the present invention illustrated in FIG. 1 has a silicon-based substrate 12, an initial layer 14 provided on the silicon-based substrate 12, a buffer layer 16 provided on the initial layer 14 and an operation layer 22 provided on the buffer layer 16.

Here, the silicon-based substrate 12 is, for example, a substrate comprised of Si or SiC. Further, the initial layer 14 is, for example, a layer comprised of AlN.

The buffer layer 16 can be a stacked body in which a first layer 15 comprised of a nitride semiconductor and a second layer 17 comprised of a nitride semiconductor having different composition from that in the first layer are repeatedly stacked. The first layer 15 is comprised of, for example, $Al_yGa_{1-y}N$, and the second layer 17 is comprised of, for example, $Al_xGa_{1-x}N$ ($0 \leq x < y \leq 1$).

More specifically, the first layer 15 can be AlN, and the second layer 17 can be GaN.

The operation layer 22 can include a channel layer 18 and a barrier layer 20 provided on the channel layer 18. The channel layer 18 is comprised of, for example, GaN, and the barrier layer 20 is comprised of, for example, AlGaN.

Further, the buffer layer 16 contains boron, and a concentration of boron in the buffer layer 16 gradually decreases toward a side of the operation layer 22 from a side of the silicon-based substrate 12.

Because the buffer layer 16 has a boron concentration profile as described above, the concentration of boron is high in a lower layer of the buffer layer 16, so that it is possible to obtain a dislocation suppression effect and suppress pit generation in the operation layer which is epitaxially grown on the buffer layer 16.

Further, the concentration of boron is low in an upper layer of the buffer layer, so that it is possible to suppress influence of impurities (degradation of characteristics of the device or degradation of crystallinity due to impurities) on the operation layer.

Further, it is preferable that both of the first layer 15 and the second layer 17 in the buffer layer 16 contain boron.

When both of the first layer 15 and the second layer 17 contain boron, it is possible to more effectively suppress dislocation.

Further, it is preferable that the concentration of boron of the silicon-based substrate 12 is higher than the concentration of boron in a region at a side of the silicon-based substrate in the buffer layer 16.

When the concentration of boron of the silicon-based substrate is higher than the concentration of boron in the region at the side of the silicon-based substrate in the buffer layer, it is possible to more effectively suppress dislocation.

A semiconductor device using the semiconductor substrate of the present invention will be described next.

Figure 3:
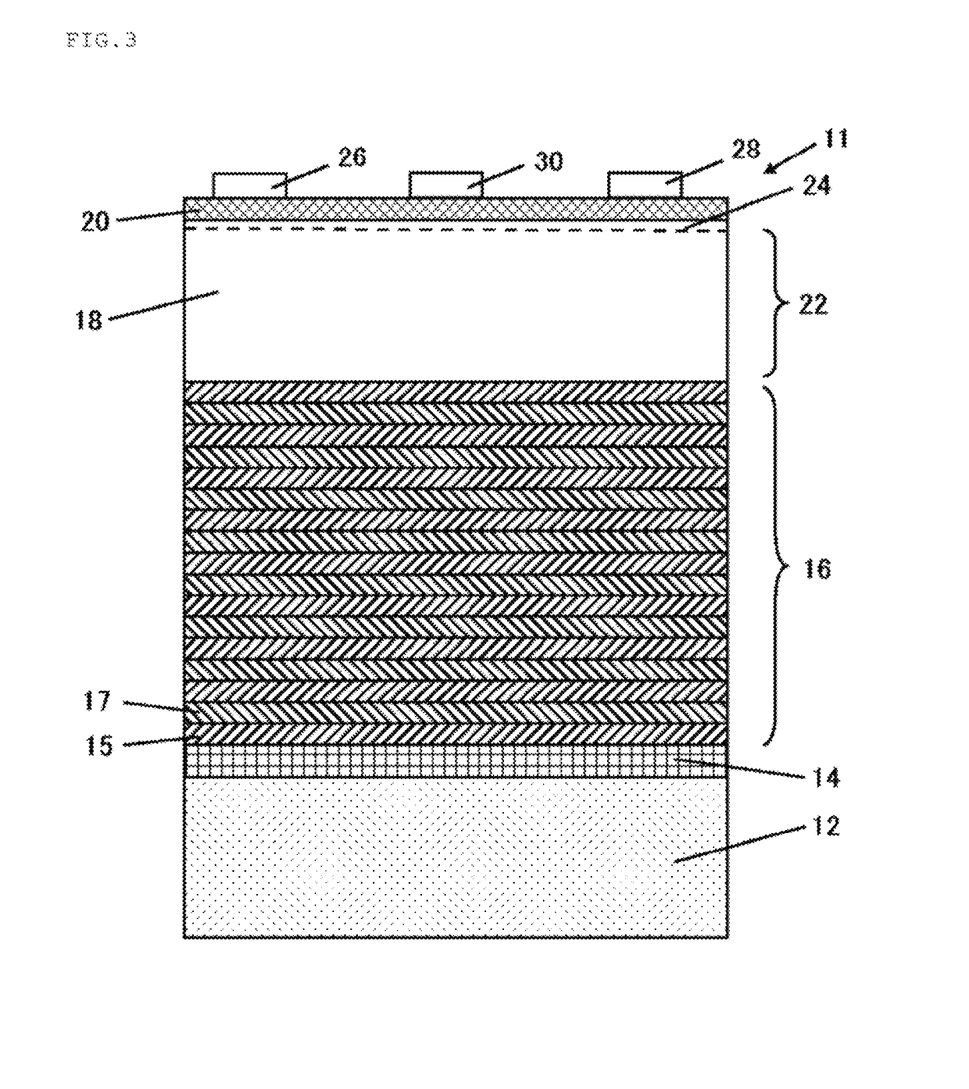
FIG. 3 is a schematic cross-sectional view illustrating an example of a semiconductor device according to an embodiment of the present invention.

FIG. 3 is a schematic cross-sectional view illustrating an example of the semiconductor device of the present invention.

The semiconductor device 11 of the present invention illustrated in FIG. 3 has a silicon-based substrate 12, an initial layer 14 provided on the silicon-based substrate 12, a buffer layer 16 provided on the initial layer 14 and an operation layer 22 provided on the buffer layer 16.

The operation layer 22 has a channel layer 18 and a barrier layer 20 provided on the channel layer 18.

The semiconductor device 11 further has a first electrode 26, a second electrode 28 and a control electrode 30, which are provided on the operation layer 22.

In the semiconductor device 11, the first electrode 26 and the second electrode 28 are disposed such that a current flows from the first electrode 26 to the second electrode 28 via two dimensional electron gas 24 formed inside the channel layer 18.

The current flowing between the first electrode 26 and the second electrode 28 can be controlled by potential applied to the control electrode 30.

Further, the buffer layer 16 contains boron, and a concentration of boron in the buffer layer 16 gradually decreases toward a side of the operation layer 22 from a side of the silicon-based substrate 12.

Because the buffer layer 16 has a boron concentration profile as described above, the concentration of boron is high in a lower layer of the buffer layer 16, so that it is possible to obtain a dislocation suppression effect and suppress pit generation in the operation layer formed on the buffer layer.

Further, the concentration of boron is low in an upper layer of the buffer layer, so that it is possible to suppress influence of impurities (degradation of characteristics of the device or degradation of crystalline due to impurities) on the operation layer.

A method of manufacturing the semiconductor device of the present invention will be described next.

First, an initial layer 14 is formed on a silicon-based substrate 12. More specifically, the initial layer 14 comprised of AlN is grown by 10 to 300 nm using a MOVPE (metal organic vapor phase epitaxy) method.

Then, a buffer layer 16 is formed on the initial layer 14. More specifically, a first layer 15 comprised of AlN and a second layer 17 comprised of GaN are alternately grown using the MOVPE method. A film thickness of the first layer 15 is, for example, 3 to 7 nm, and a film thickness of the second layer 17 is, for example, 2 to 7 nm.

Subsequently, an operation layer 22 is formed on the buffer layer 16. More specifically, a channel layer 18 comprised of GaN and a barrier layer 20 comprised of AlGaN are sequentially grown on the buffer layer 16 using the MOVPE method. A film thickness of the channel layer 18 is, for example, 1000 to 4000 nm, and a film thickness of the barrier layer 20 is, for example, 10 to 50 nm.

Then, a first electrode 26, a second electrode 28 and a control electrode 30 are formed on the barrier layer 20. The first electrode 26 and the second electrode 28 can be formed with, for example, a stacked film of Ti/Al, and the control electrode 30 can be formed with, for example, a lower layer comprised of metal oxide such as SiO and SiN, and an upper layer comprised of a metal such as Ni, Au, Mo and Pt.

In the step of forming the buffer layer 16, boron is introduced into the buffer layer 16 such that a concentration of boron in the buffer layer 16 gradually decreases toward a side of the operation layer 22 from a side of the silicon-based substrate 12.

Here, to achieve such a boron concentration profile, boron can be introduced into the buffer layer 16 by diffusing boron in the buffer layer 16 from the silicon-based substrate 12 in which boron is doped by thermal diffusion.

In this manner, by diffusing boron in the buffer layer from the silicon-based substrate in which boron is doped in high concentration by thermal diffusion, it is possible to more efficiently cause the concentration of boron in the buffer layer to gradually decrease toward the side of the operation layer from the side of the silicon-based substrate. In this case, the concentration of boron of the high-concentration doped silicon-based substrate to be used is preferably, for example, $5 \times 10^{19}$ atoms/cm$^3$ or higher.

Further, boron can be introduced into the buffer layer 16 by doping boron from a vapor phase by introducing dopant gas during the formation of the buffer layer 16 by vapor phase epitaxial growth.

At this time, by performing control so that a gas flow rate of dopant gas containing boron is decreased during vapor phase epitaxy of the buffer layer 16, it is also possible to cause the concentration of boron in the buffer layer 16 to gradually decrease toward the side of the operation layer 22 from the side of the silicon-based substrate 12.

In this manner, by doping boron from the vapor phase by introducing dopant gas during vapor phase epitaxy and introducing boron into the buffer layer 16, the buffer layer 16 can contain boron sufficient to obtain a dislocation suppression effect even if the concentration of boron of the silicon-based substrate 12 is not made high.

EXPERIMENTAL EXAMPLES

While the present invention will be more specifically described below using experimental examples, the present invention is not limited to these examples.

Experimental Example 1

As a substrate, a silicon single-crystal substrate whose substrate resistivity was 2 mΩ·cm and whose concentration of boron was $5 \times 10^{19}$ atoms/cm$^3$, was used, and a buffer layer 16 and an operation layer 22 were formed on the substrate to manufacture a semiconductor substrate as illustrated in FIG. 1

It should be noted that boron was introduced into the buffer layer 16 by diffusing boron in the buffer layer 16 from the silicon-based substrate 12 in which boron was doped by thermal diffusion.

Figure 2:
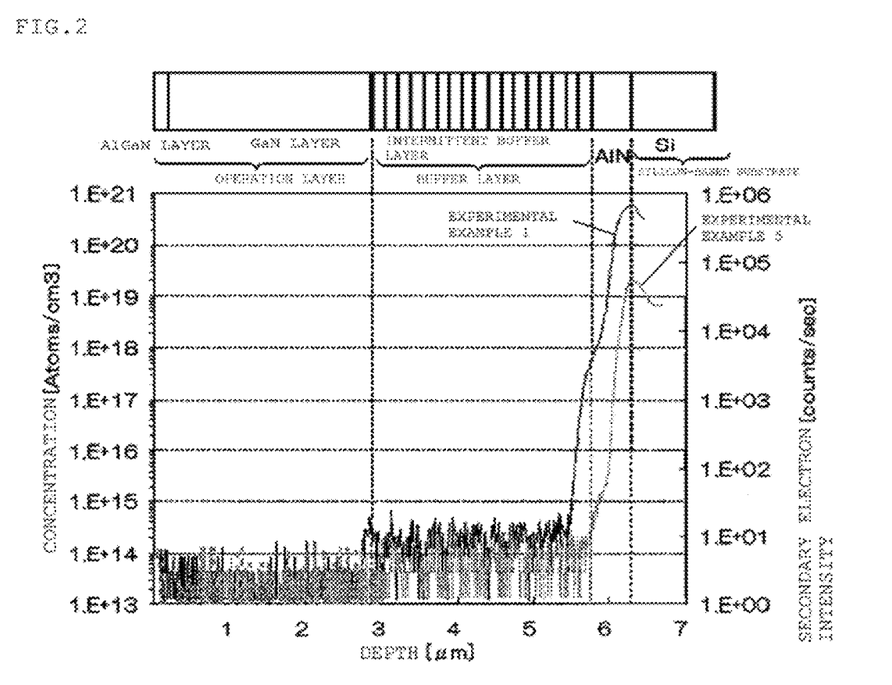
FIG. 2 is a graph illustrating a boron concentration profile of a semiconductor substrate in Experimental example 1 and Experimental example 5.

A boron concentration profile in a depth direction of the semiconductor substrate in Experimental example 1 was measured by SIMS measurement. The measurement result is illustrated in FIG. 2.

Figure 4:
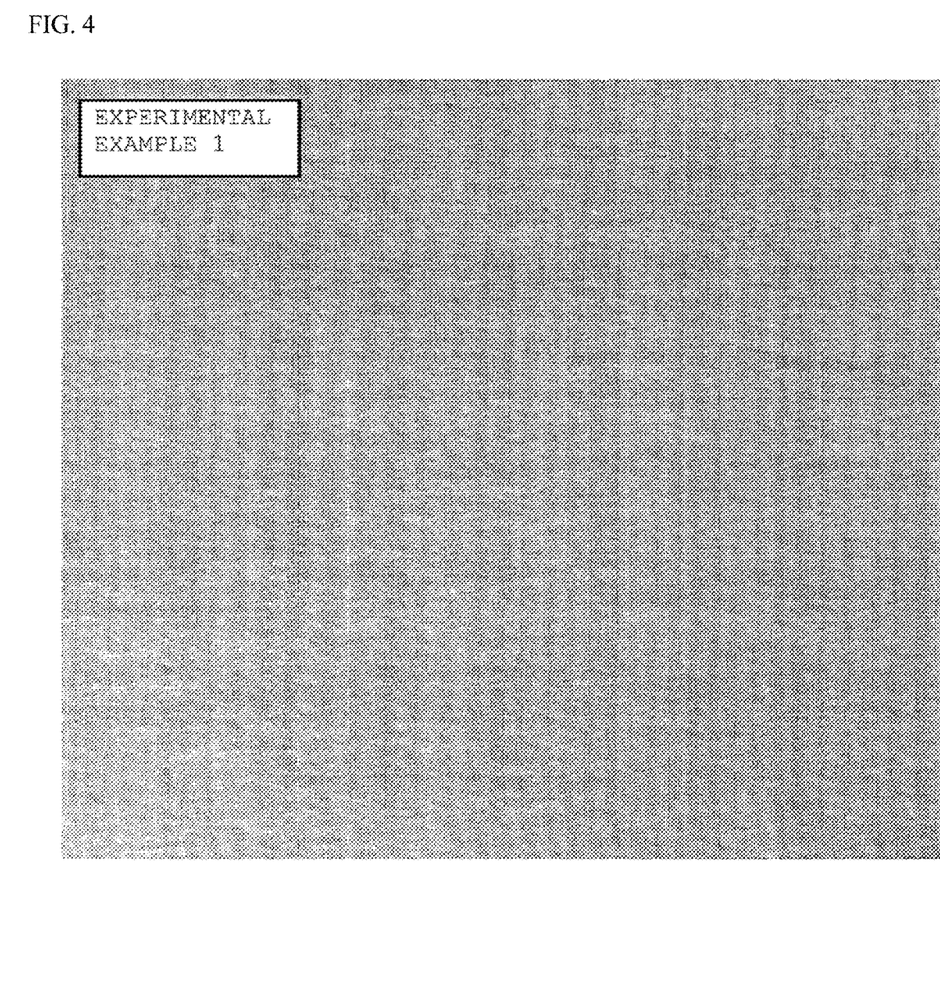
FIG. 4 is a result of observation of a central part of a surface of an operation layer in Experimental example 1.

Further, a surface of a central part of the operation layer 22 of the semiconductor substrate of Experimental example 1 was observed using a microscope. The result of observation of the surface is illustrated in FIG. 4. As can be seen from FIG. 4, no pit (defect) could be found on the surface of the operation layer 22 of the semiconductor substrate of Experimental example 1.

Further, pit density (pieces/cm$^2$) was calculated from the result of observation of the surface. The result is indicated in Table 1.

Experimental Example 2

A semiconductor substrate was manufactured in a similar manner to Experimental example 1, except that a silicon-based substrate whose substrate resistivity was 3 to 4 mΩ·cm and whose concentration of boron was $3 \times 10^{19}$ atoms/cm$^3$ was used.

As with Experimental example 1, a surface of a central part of the operation layer 22 of the semiconductor substrate of Experimental example 2 was observed. Pit density (pieces/cm$^2$) was calculated from the result of observation of the surface. The result is indicated in Table 1.

Experimental Example 3

A semiconductor substrate was manufactured in a similar manner to Experimental example 1, except that a silicon-based substrate whose substrate resistivity was 7 to 9 mΩ·cm and whose concentration of boron was $1 \times 10^{19}$ atoms/cm$^3$ was used.

As with Experimental example 1, a surface of a central part of the operation layer 22 of the semiconductor substrate of Experimental example 3 was observed. Pit density (pieces/cm$^2$) was calculated from the result of observation of the surface. The result is indicated in Table 1.

Experimental Example 4

A semiconductor substrate was manufactured in a similar manner to Experimental example 1, except that a silicon-based substrate whose substrate resistivity was 11 to 13 mΩ·cm and whose concentration of boron was $7.5 \times 10^{18}$ atoms/cm$^3$ was used.

As with Experimental example 1, a surface of a central part of the operation layer 22 of the semiconductor substrate of Experimental example 4 was observed. Pit density (pieces/cm$^2$) was calculated from the result of observation of the surface. The result is indicated in Table 1.

Experimental Example 5

A semiconductor substrate was manufactured in a similar manner to Experimental example 1, except that a silicon-based substrate whose substrate resistivity was 15 to 16 mΩ·cm and whose concentration of boron was $5 \times 10^{18}$ atoms/cm$^3$ was used.

As with Experimental example 1, a boron concentration profile in a depth direction of the semiconductor substrate of Experimental example 5 was measured by SIMS measurement. The measurement result is illustrated in FIG. 2.

Figure 5:
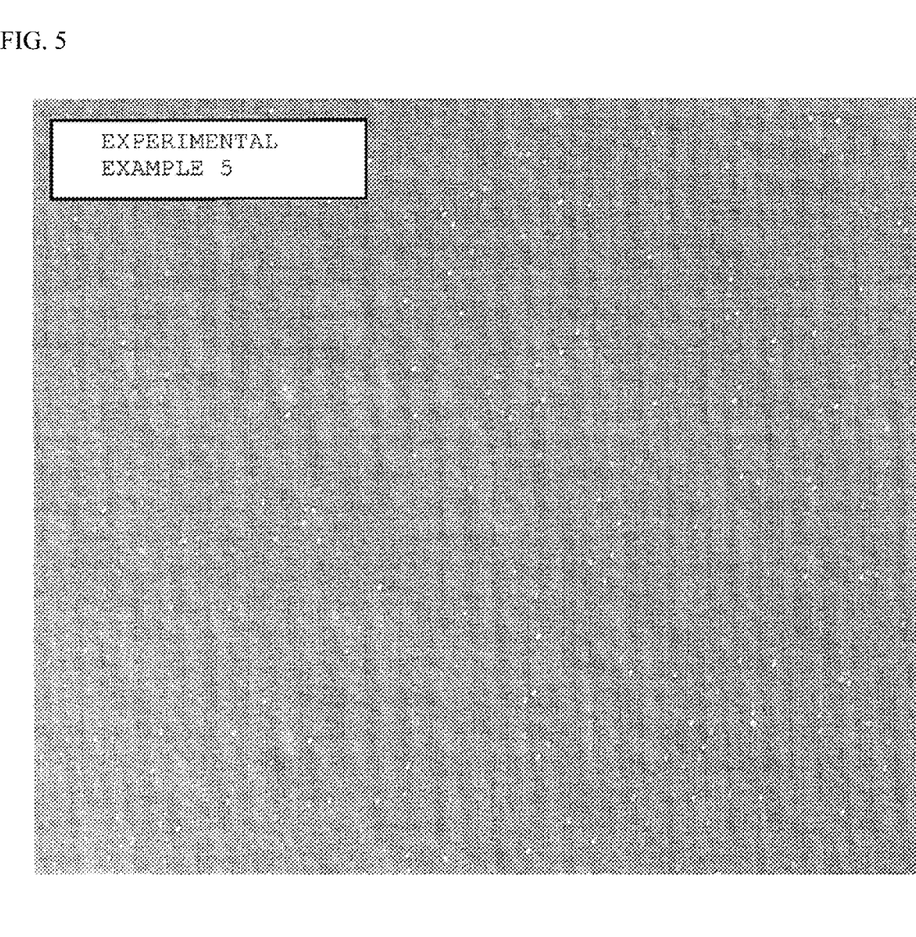
FIG. 5 is a result of observation of a central part of a surface of an operation layer in Experimental example 5.

Further, a surface of a central part of the operation layer 22 of the semiconductor substrate of Experimental example 5 was observed. As can be seen from FIG. 5, a number of pits (white spots in the figure) could be found on the surface of the operation layer 22 of the semiconductor substrate of Experimental example 5. Further, pit density (pieces/cm$^2$) was calculated from the result of observation of the surface. The result is indicated in Table 1.

TABLE 1

|  | substrate resistivity [mΩ·cm] | a concentration of boron [atoms/cm$^3$] | pit density at a central part [pieces/cm$^2$] |
|---|---|---|---|
| Experimental example 1 | 2 | $5.0 \times 10^{19}$ | 0 |
| Experimental example 2 | 3 to 4 | $3.0 \times 10^{19}$ | 8.8 |
| Experimental example 3 | 7 to 9 | $1.0 \times 10^{19}$ | 76 |
| Experimental example 4 | 11 to 13 | $7.5 \times 10^{18}$ | 760.2 |
| Experimental example 5 | 15 to 16 | $5.0 \times 10^{18}$ | 37719.3 |

As can be seen from Table 1, when the concentration of boron of the silicon-based substrate is higher (the substrate resistivity of the silicon-based substrate is lower), pit density of the surface of the operation layer (that is, defect density) becomes smaller.

As can be seen from FIG. 2, in Experimental example 1 in which pit density of the surface of the operation layer 22 is small, the concentration of boron in the buffer layer 16 becomes higher compared to Experimental example 5 in which pit density of the surface of the operation layer 22 is large and gradually decreases toward the operation layer. It can be considered that since a dislocation suppression effect in the buffer layer 16 can be obtained in Experimental example 1 by the above boron profile, the pit density of the surface of the operation layer 22 becomes small.

It should be noted that the present invention is not limited to the above-described embodiment. The above-described embodiment is an example, and any modification having an identical structure with and having a similar operational effect to technical idea described in the claims of the present invention can be incorporated in a technical scope of the present invention.

The invention claimed is:

1. A semiconductor substrate comprising:
    a silicon-based substrate;
    a buffer layer provided on the silicon-based substrate and comprised of a nitride semiconductor containing boron; and
    an operation layer formed on the buffer layer,
    wherein the buffer layer has a stacked body comprising of three or more layers, and
    a concentration of boron in the stacked body gradually decreases toward a side of the operation layer from a side of the silicon-based substrate.

2. The semiconductor substrate according to claim 1, wherein a concentration of boron in a region at a side of the operation layer in the buffer layer is less than $5 \times 10^{16}$ atoms/cm$^3$.

3. The semiconductor substrate according to claim 1, wherein the buffer layer is stacked such that a first layer comprised of $Al_yGa_{1-y}N$ and a second layer comprised of $Al_xGa_{1-x}N(0 \leq x \leq y \leq 1)$ are repeatedly stacked.

4. The semiconductor substrate according to claim 2, wherein the buffer layer is stacked such that a first layer comprised of $Al_yGa_{1-y}N$ and a second layer comprised of $Al_xGa_{1-x}N(0 \leq x \leq y \leq 1)$ are repeatedly stacked.

5. The semiconductor substrate according to claim 1, wherein a concentration of boron of the silicon-based substrate is higher than a concentration of boron in a region at a side of the silicon-based substrate in the buffer layer.

6. The semiconductor substrate according to claim 2, wherein a concentration of boron of the silicon-based substrate is higher than a concentration of boron in a region at a side of the silicon-based substrate in the buffer layer.

7. The semiconductor substrate according to claim 3, wherein a concentration of boron of the silicon-based substrate is higher than a concentration of boron in a region at a side of the silicon-based substrate in the buffer layer.

8. The semiconductor substrate according to claim 4, wherein a concentration of boron of the silicon-based substrate is higher than a concentration of boron in a region at a side of the silicon-based substrate in the buffer layer.

9. A semiconductor device comprising:
the semiconductor substrate according to claim 1;
a first electrode formed on the operation layer; and
a second electrode formed on the operation layer,
wherein the first electrode and the second electrode are disposed such that a current flows from the first electrode to the second electrode via the operation layer.

10. A semiconductor device comprising:
the semiconductor substrate according to claim 2;
a first electrode formed on the operation layer; and
a second electrode formed on the operation layer,
wherein the first electrode and the second electrode are disposed such that a current flows from the first electrode to the second electrode via the operation layer.

11. A semiconductor device comprising:
the semiconductor substrate according to claim 3;
a first electrode formed on the operation layer; and
a second electrode formed on the operation layer,
wherein the first electrode and the second electrode are disposed such that a current flows from the first electrode to the second electrode via the operation layer.

12. A semiconductor device comprising:
the semiconductor substrate according to claim 4;
a first electrode formed on the operation layer; and
a second electrode formed on the operation layer,
wherein the first electrode and the second electrode are disposed such that a current flows from the first electrode to the second electrode via the operation layer.

13. A semiconductor device comprising:
the semiconductor substrate according to claim 5;
a first electrode formed on the operation layer; and
a second electrode formed on the operation layer,
wherein the first electrode and the second electrode are disposed such that a current flows from the first electrode to the second electrode via the operation layer.

14. A method of manufacturing a semiconductor device comprising:
forming a buffer layer comprised of a nitride semiconductor on a silicon-based substrate, the buffer layer having a stacked body comprising of three or more layers; and
forming an operation layer on the buffer layer,
wherein the step of forming the buffer layer comprises a stage in which boron is introduced into the buffer layer such that a concentration of boron in the buffer layer gradually decreases toward a side of the operation layer from a side of the silicon-based substrate.

15. The method of manufacturing the semiconductor device according to claim 14, wherein the stage in which boron is introduced into the buffer layer comprises a stage in which boron is diffused in the buffer layer from the silicon-based substrate in which boron is doped by thermal diffusion.

16. The method of manufacturing the semiconductor device according to claim 14, wherein the stage in which boron is introduced into the buffer layer comprises a stage in which boron is doped from a vapor phase by introducing dopant gas when the buffer layer is formed by vapor phase epitaxial growth.

17. The method of manufacturing the semiconductor device according to claim 15, wherein the stage in which boron is introduced into the buffer layer comprises a stage in which boron is doped from a vapor phase by introducing dopant gas when the buffer layer is formed by vapor phase epitaxial growth.

18. The method of manufacturing the semiconductor device according to claim 14,
wherein a stacked body in which a first layer comprised of $Al_yGa_{1-y}N$ and a second layer comprised of $Al_xGa_{1-x}N(0 \leq x \leq y \leq 1)$ are repeatedly stacked is formed as the buffer layer, and
both of the first layer and the second layer contain the boron.

19. The method of manufacturing the semiconductor device according to claim 15,
wherein a stacked body in which a first layer comprised of $Al_yGa_{1-y}N$ and a second layer comprised of $Al_xGa_{1-x}N(0 \leq x \leq y \leq 1)$ are repeatedly stacked is formed as the buffer layer, and
both of the first layer and the second layer contain the boron.

20. The method of manufacturing the semiconductor device according to claim 14,
wherein a concentration of boron of the silicon-based substrate is made higher than a concentration of boron in a region at a side of the silicon-based substrate in the buffer layer.

* * * * *